United States Patent [19]

Date

[11] Patent Number: 5,060,369
[45] Date of Patent: Oct. 29, 1991

[54] PRINTED WIRING BOARD CONSTRUCTION

[75] Inventor: Parshuram G. Date, Novi, Mich.

[73] Assignee: Ford Motor Company, Dearborn, Mich.

[21] Appl. No.: 473,247

[22] Filed: Jan. 31, 1990

[51] Int. Cl.[5] ............................................. C23C 26/00
[52] U.S. Cl. ........................................ 29/830; 29/847; 29/884; 29/850; 427/96
[58] Field of Search ................... 427/96; 29/850, 830, 29/847, 884

[56] References Cited

U.S. PATENT DOCUMENTS

| | | | |
|---|---|---|---|
| 3,464,855 | 9/1969 | Shaheen | 427/96 |
| 3,693,135 | 9/1972 | Vavrick et al. | 339/75 MP |
| 3,701,123 | 10/1972 | Barrett et al. | 340/173 LS |
| 3,922,051 | 11/1975 | Reynolds | 339/17 C |
| 3,973,817 | 8/1976 | Stalley et al. | 339/14 R |
| 4,183,629 | 1/1980 | Nishimura et al. | 350/334 |
| 4,288,841 | 9/1981 | Gogal | 361/414 |
| 4,303,291 | 12/1981 | Dines | 427/96 |
| 4,514,042 | 4/1985 | Nukii et al. | 350/331 R |
| 4,554,732 | 11/1985 | Sadlo | 427/96 |
| 4,629,289 | 12/1986 | Streit | 350/336 |
| 4,684,974 | 8/1987 | Matsunaga et al. | 357/68 |
| 4,746,198 | 5/1988 | Baeger | 350/336 |

OTHER PUBLICATIONS

"Solving Problems with Elastomeric Connectors", by Ben Carlisle, Machine Design, vol. 55, No. 27, Nov. 24, 1983.

Primary Examiner—Shrive Beck
Assistant Examiner—Vi Duong Dang
Attorney, Agent, or Firm—Paul K. Godwin, Jr.; Clifford L. Sadler

[57] ABSTRACT

A method of fabricating a printed wiring substrate board to have integral contacts over the thickness of a defined connector edge in order to allow for perpendicular mating to exposed conductors on the surface of a second substrate.

5 Claims, 2 Drawing Sheets

PRINTED WIRING BOARD CONSTRUCTION

BACKGROUND OF THE INVENTION

1. Field of the Invention

The present invention is directed to the field of electrical connectors and more specifically to the area of interconnecting a plurality of printed wiring boards.

2. Description of the Prior Art

Various engineering applications require the interconnection of printed wiring or printed circuit boards. In some instances, it is necessary that the boards be oriented perpendicular with respect to each other.

In U.S. Pat. No. 3,693,135, a printed circuit board is shown mounted in a socket and retained therein by a holding frame. The printed circuit board has a plurality of circuit elements printed thereon and a plurality of contact "tails". The contact tails connect to the printed circuit elements and extend to the bottom of the board in parallel arrangement so as to make contact with corresponding terminals within the socket element. Flexible wiring between sockets would provide interconnection between printed wiring boards held in the sockets.

In a Nov. 24, 1983, article from *Machine Design*, Vol. 55, No. 27, entitled, "Solving Problems with Elastomeric Connectors" by Ben Carlisle, layered elastomeric connectors are described. Elastomeric connectors are comprised of stacked alternate sheets of conducting and nonconductive elastomeric material and are usually placed between the terminals formed on the surface of one printed circuit board and those on the surface of another. The elastomeric connector is described as providing interconnection of the oppositely disposed terminals. That article also describes a perpendicular connection between a mother board and a daughter board. In that configuration the surface terminals of one board and the surface terminals of the other board are interconnected at a perpendicular joint by the elastomeric connector being compressed into the joint.

SUMMARY OF THE INVENTION

It is an object of the present invention to provide interconnection between two perpendicularly disposed conductor surfaces without the use of sockets or wiring harnesses.

It is another object of the Present invention to provide an elastomeric connector between two perpendicularly disposed conducting surface circuit boards to obtain interconnection therebetween.

It is a further object of the present invention to provide a uniquely formed printed circuit board that contains electrically isolated end terminals integrally formed on its defined connector edge.

It is still a further object of the present invention to provide a composite structure for a liquid crystal display in which perpendicularly disposed printed wiring boards are interconnected with the surface terminals on the liquid crystal display element.

DETAILED DESCRIPTION OF THE PREFERRED EMBODIMENT

In those instances where it is necessary to install a printed wiring board perpendicular to another and provide interconnection therebetween, the present invention is ideally suited. It provides integrated electrical contacts that extend from the edge of the printed wiring board so that they may be interconnected with exposed conductors on the surface of a second board.

Figure 1:
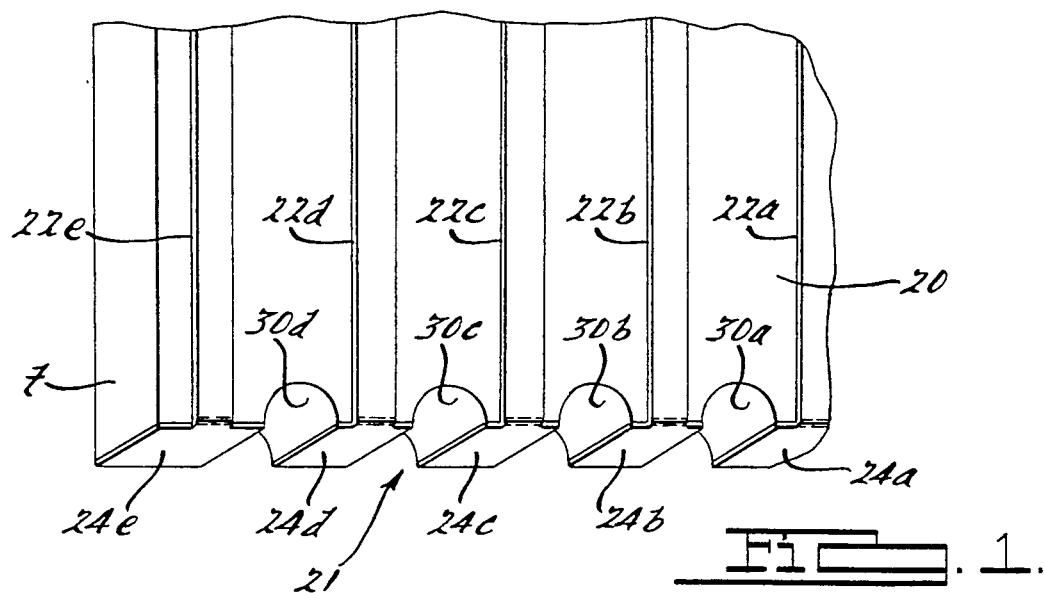
FIG. 1 is a perspective view of a portion of a printed wiring board containing the present invention.

FIG. 1 illustrates a portion of a printed wiring board 20 having a first layer of electrically conducting material disposed in a predetermined pattern and having portions 22a, . . . 22e extending towards and adjacent to the connector edge 21.

The substrate 20 is a conventional insulator material that may be ceramic or of other composite resin based materials suitable for supporting the desired wiring pattern and any electrical components that may be mounted thereon. The substrate 20 has a known thickness "t" and a defined linear connector edge 21.

A second layer 24 of conducting material is deposited over the edge 21 of the substrate 20 so as to provide an electrically conductive surface over the thickness t of the edge 21 that connects with the first layer on the surface of the substrate 20. Arcuate shaped cuts 30a . . . 30d are shown in FIG. 1 along the edge 21 to separate the layer 24 into individual connector pads 24a . . . 24e.

Figure 2:
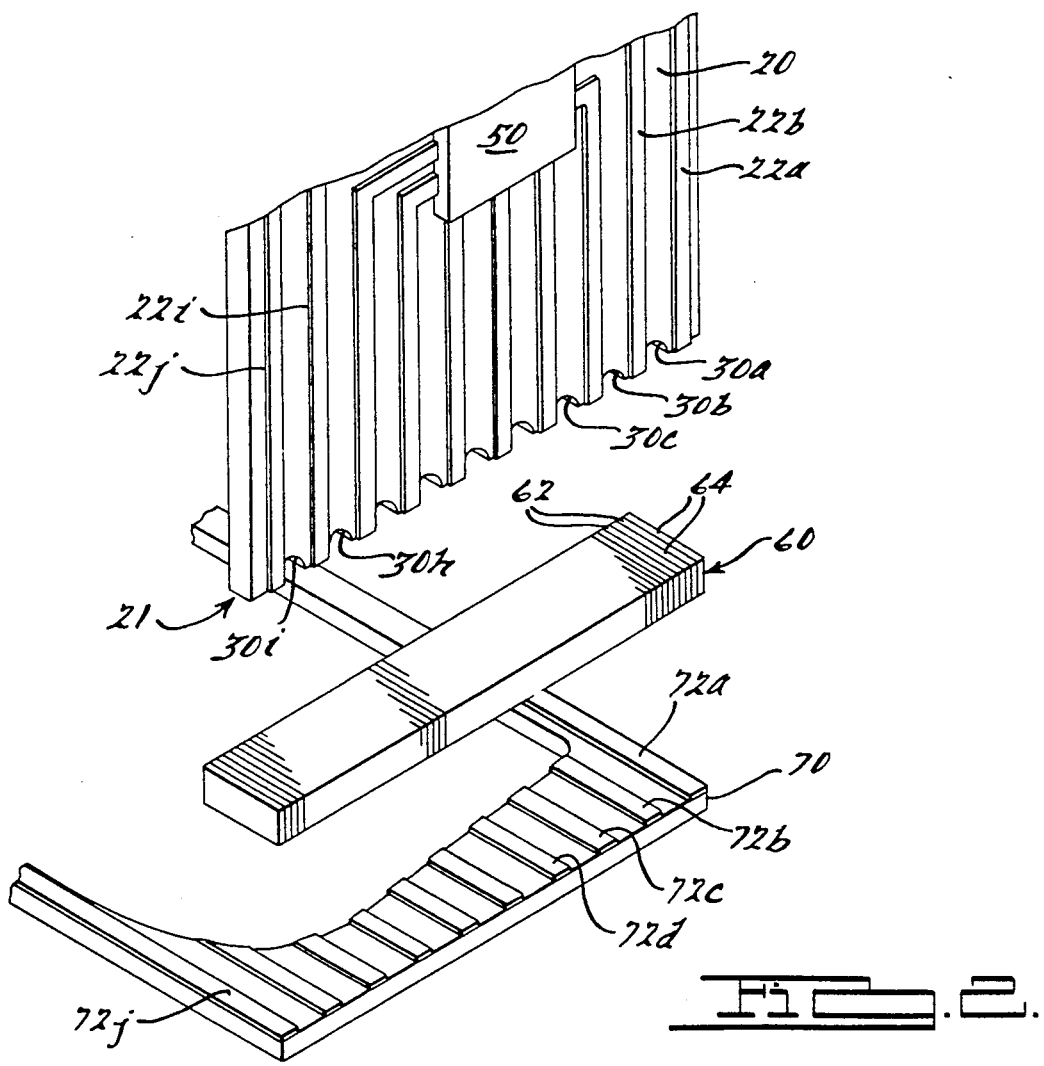
FIG. 2 is an exploded view of a printed wiring board containing the present invention and other components which make up an interconnected assembly.

In FIG. 2, a larger portion of the printed wiring board substrate 20 is shown which contains a printed wiring pattern 22a . . . 22j and an electronic component 50. The connector edge 21 is shown opposing an elastomer connector material 60. The elastomer connector material 60 is a conventional product which is available commercially from PCK Elastomerics, Inc. of Hatboro, Pa. or Technic of Cranford, N.J. The elastomeric connector material is normally configured as a stack of alternate sheets of conductive and nonconductive elastomeric material that is disposed to carry electrical currents across the stack. In this case, element 62 represents a conductive layer and element 64 represents a nonconductive layer. Generally the conductive layers number approximately 240 per inch. Other densities ranging from 100 to 600 conductive layers per inch are also available. Therefore, several conductive layers provide interconnection between conductors on each printed circuit board.

Element 70 represents a substrate lying in a plane that is substantially perpendicular to the orientation of substrate 20 and contains a plurality of exposed electrical conductors such as 72a . . . 7j indicated on its surface. The substrate 70 may be another printed circuit board or it may be the peripheral portion of a substrate such as that which leads to a liquid crystal display. In any event, the assembled elements 20, 60 and 70 of FIG. 2 provide that the connector edge 21 abuts the upper surface of the elastomer connector 60 and the lower surface of the elastomer connector 60 contacts the exposed conductors 72a+ on substrate 70.

Figure 3:
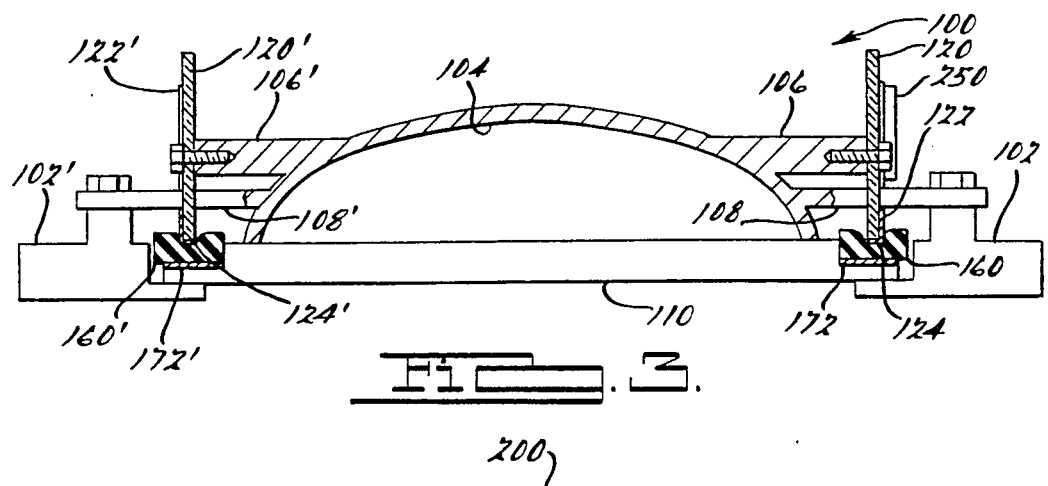
FIG. 3 is a cross-sectional view of a liquid crystal display panel assembly utilizing the present invention.

In FIG. 3 the composite elements shown in FIG. 2 are illustrated as part of a liquid crystal display assembly 100. The first substrates 120 and 120' are shown as each having a defined connector edge with edge connector elements 124 (124') compressed against an elastomer connector 160 (160'). Therefore, contact is made with the exposed electrical conductors 172 (172') on the perpendicularly oriented surface on substrate 110. In this case, the substrate 110 comprises a liquid crystal display cell. A light reflector 104 lies behind the liquid crystal display cell on substrate 110. The reflector 104 contains oppositely extending support arms 106, 106', 108 and 108' which are used to interconnect the various elements which make the compressive connection between the edge connector elements 124 (124') on board 120 (120') to the electrical conductors 172 (172') on the perpendicularly oriented substrate 110.

Figure 4:
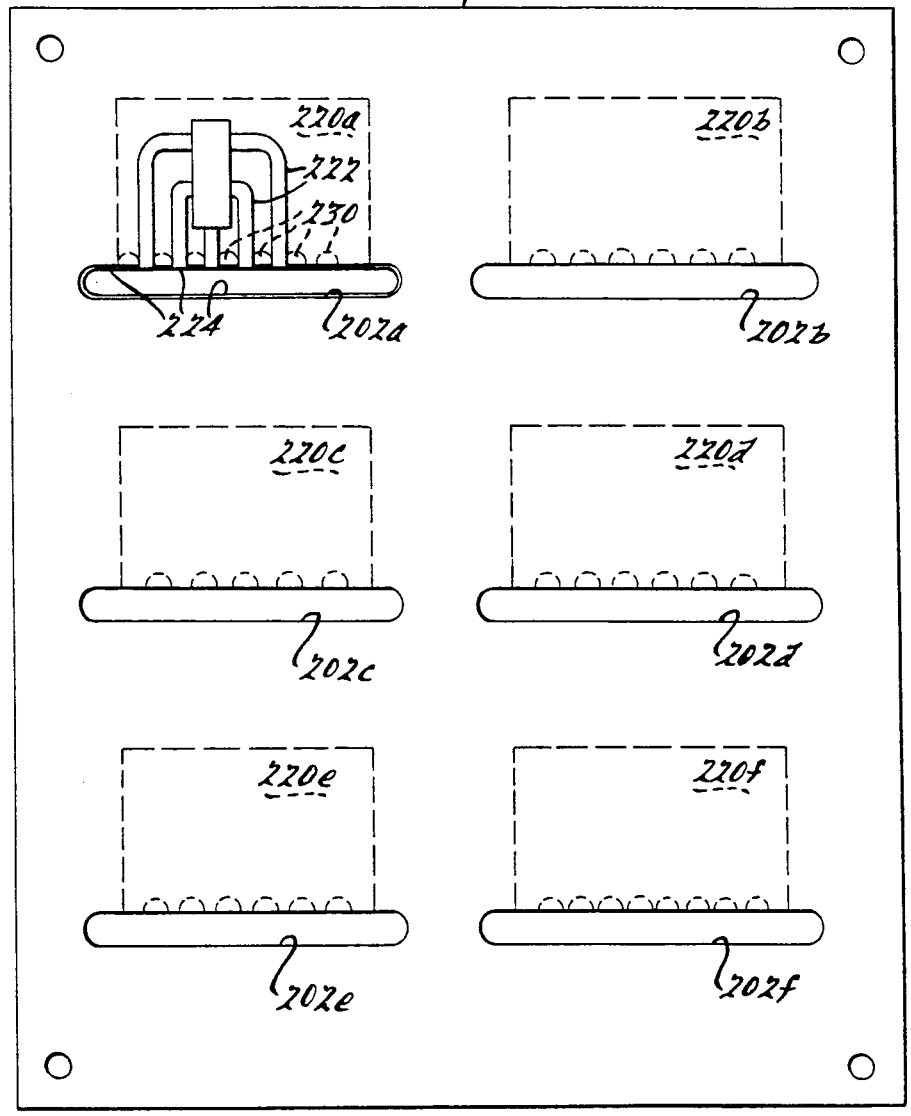
FIG. 4 is a plan view of a large substrate board used in a method of manufacturing the present invention.

FIG. 4 represents a mother board that is used in the process of manufacturing printed wiring boards containing the connectors of the present invention on a designated connector edge as illustrated above.

The mother board 200 is normally a copper plated substrate. A plurality of slots 202a, 202b, ... 202f are cut into the board 200 to expose the thickness of the substrate. In each case the slots are configured to provide a defined linear connector edge of a smaller printed circuit board. The smaller printed circuit boards are designated in broken line configurations 220a ... 220f along one edge of each slot. The key to the process of forming the desired boards is to create a conductor surface on the (slot) edge of each board. In this case, the slots provide an unplated exposed edge of the board over its entire thickness. By using an electroless plating process, a layer of copper 224 is deposited on the exposed edge of the slot 202 so as to cover the entire thickness of the substrate. The printed wiring board is subsequently processed in a conventional manner to create a predetermined solder coated, conductive trace pattern in layer 222 and having portions thereof extend to areas adjacent to the edge of the slot 202 and to be electrically connected with the entire solder coated layer 224. Individual boards 220a, 220b ... 220f are cut from the mother board 200 by a punch process. As part of that punch process, small portions 230 of the printed circuit board substrate 200 are trimmed from the slot edge between each portion of the conductive trace pattern 222 extending to the connector edge. The result is a printed wiring board having a plurality of linearly disposed connector elements deposited across the edge thickness of the board. Each of the integrated connector elements have surfaces that are normal to the surface of the board and extend from the edge in a direction that is parallel to the surface of the board.

It will be apparent that many modifications and variations may be implemented without departing from the scope of the novel concept of this invention. Therefore, it is intended by the appended claims to cover all such modifications and variations which fall within the true spirit and scope of the invention.

I claim:

1. A method of fabricating a printed wiring board comprising the steps of:
   supplying a substrate board having a designated linear connector edge;
   depositing a predetermined wiring pattern of electrically conducting layers on at least one surface of said substrate extending to said connector edge;
   depositing a second electrically conducting layer of material over the thickness of said connector edge; and
   trimming portions of said connector edge to remove portions of said second layer therefrom and thereby form edge contacts along the board thickness that are electrically isolated from each other.

2. A method of fabricating a printed wiring board as in claim 1, wherein said substrate board is supplied with a plurality of elongated slots formed therein to define said linear connector edge for a plurality of smaller printed wiring boards, said steps of claim 1 are applied to each of said smaller printed wiring boards and a step of separating said smaller boards from each other.

3. A method of creating a plurality of separate electrical contacts on an edge of a printed wiring board comprising the steps of:
   supplying a substrate board material having a designated linear connector edge;
   depositing a predetermined wiring pattern of electrically conducting layers on at least one surface of said substrate board extending to predetermined areas immediately adjacent said connector edge;
   coating said connector edge with a layer of electrically conducting material in a manner extend over the thickness of to said board edge and said adjacent portions of said wiring pattern layers; and
   trimming away a portion of said connector edge to electrically isolate said adjacent portions of said wiring pattern layers connected to said edge layer, leaving a corresponding set of edge contacts along the thickness of said printed wiring board.

4. A method of interconnecting a plurality of printed wiring boards, comprising the steps of:
   providing a first board with a first predetermined conductor trace pattern exposed on one of its surfaces;
   providing an elastomeric connector strip across a portion of said exposed pattern;
   providing a second board with a second predetermined conductor trace pattern on at least one of its surfaces at least one linear edge, said second board contains a set of electrical contacts formed over the thickness of said one edge;
   orienting said second board to be approximately normal with respect to the first board; and
   compressing said elastomeric connector strip between said one edge of said second board and said exposed pattern of said surface of said first board.

5. A method as in claim 4, wherein said elastomeric connector contains a plurality of closely spaced and mutually insulated conductors within an elastomeric block, whereby several conductors interconnect each conductor trace patterned on said first board with the corresponding contact on said second board.

* * * * *